(12) United States Patent
Kim et al.

(10) Patent No.: US 8,847,216 B2
(45) Date of Patent: Sep. 30, 2014

(54) ORGANIC LIGHT EMITTING DISPLAY DEVICE

(71) Applicant: LG Display Co., Ltd., Seoul (KR)

(72) Inventors: Hwa Kyung Kim, Gyeonggi-do (KR); Chang Wook Han, Seoul (KR); Do Hyung Kim, Seoul (KR); Hongseok Choi, Seoul (KR); Yoon Heung Tak, Gyeonggi-do (KR); Ki-Woog Song, Jeonbuk (KR); Mi-Young Han, Gyeonggi-do (KR); Jimin Kim, Incheon (KR); Hye Min Oh, Seoul (KR)

(73) Assignee: LG Display Co., Ltd., Seoul (KR)

( * ) Notice: Subject to any disclaimer, the term of this patent is extended or adjusted under 35 U.S.C. 154(b) by 13 days.

(21) Appl. No.: 13/724,308

(22) Filed: Dec. 21, 2012

(65) Prior Publication Data

US 2013/0175512 A1    Jul. 11, 2013

(30) Foreign Application Priority Data

Dec. 23, 2011  (KR) .................. 10-2011-0141810
Sep. 27, 2012  (KR) .................. 10-2012-0108375

(51) Int. Cl.
*H01L 51/52*    (2006.01)
*H01L 27/32*    (2006.01)
*H01L 51/50*    (2006.01)

(52) U.S. Cl.
CPC ........ *H01L 51/5203* (2013.01); *H01L 27/3209* (2013.01); *H01L 51/5004* (2013.01); *H01L 27/3244* (2013.01)
USPC ........................................ 257/40

(58) Field of Classification Search
CPC . H01L 33/00; H01L 51/5203; H01L 51/5262; H01L 51/52; H01J 1/62
USPC ........... 257/79–103, 57, 59, 66, 72, 359, 390, 257/443, E21.411, E21.412, E51.005, 257/E29.151, E27.1, E29.117
See application file for complete search history.

(56) References Cited

U.S. PATENT DOCUMENTS

| | | | |
|---|---|---|---|
| 2005/0249972 A1* | 11/2005 | Hatwar et al. ............... | 428/690 |
| 2007/0120453 A1* | 5/2007 | Hwang et al. ............... | 313/112 |
| 2008/0278066 A1* | 11/2008 | Spindler et al. ............. | 313/504 |
| 2008/0297036 A1* | 12/2008 | Noh et al. .................... | 313/504 |
| 2009/0009076 A1* | 1/2009 | Maru et al. .................. | 313/506 |

FOREIGN PATENT DOCUMENTS

JP        2001-052873     *  2/2001  ............. H05B 33/22

* cited by examiner

*Primary Examiner* — Fernando L Toledo
*Assistant Examiner* — Lawrence-Linh T Nguyen
(74) *Attorney, Agent, or Firm* — Morgan, Lewis & Bockius LLP

(57) ABSTRACT

Disclosed is an organic light emitting display device. The organic light emitting display device includes a substrate, a thin film transistor formed on the substrate, a first electrode formed on the thin film transistor, an organic emission layer, and a second electrode formed on the organic emission layer. The organic emission layer includes a first stack that includes a first emission layer formed on the first electrode to emit first color light, a second stack that includes a second emission layer formed on the first electrode to emit second color light, and a charge generation layer formed between the first and second stacks.

14 Claims, 11 Drawing Sheets

| Light Compensation Layer (SiNx) | HTL1 /HTL3/ ETL2 (Å) | YG Doping | 10 mA/cm² ||| Panel Eff. (cd/A) | (Including ΔV=0.4) | Δu'v' @60° (Panel Estimation) |
|---|---|---|---|---|---|---|---|---|
| | | | cd/A | CIEx | CIEy | | | |
| 1600Å | 1250 / 350 / 450 | 14% | 75.0 | 0.319 | 0.359 | 24.5 | 9.07 | 0.011 (0.019) |
| | | 20% | 74.2 | 0.324 | 0.358 | 25.3 | 8.91 | 0.007 (0.015) |

FIG. 9

|   | HTL1 | HTL3 | ETL2 | YG Doping % | Voled | Cd/A | CIEx | CIEy | EQE | Panel Eff. | Δu'v' |
|---|---|---|---|---|---|---|---|---|---|---|---|
| a | 600 | 450 | 450 | 20% | 8.7 | 72.7 | 0.324 | 0.350 | 28.45 | 25.3 | 0.008 |
| b | 600 | 450 | 450 | 14% | 8.9 | 75.8 | 0.315 | 0.361 | 28.82 | 23.1 | 0.011 |

FIG. 12

| YG Doping % | Voled | Cd/A | QE(%) | Cd/m2 | CIEx | CIEy | Panel Eff. | Δu'v' |
|---|---|---|---|---|---|---|---|---|
| 14% | 8.9 | 71.2 | 27.96057 | 7120 | 0.3233 | 0.348 | 25.1 | 0.036 |
| 20% | 8.7 | 71.87 | 28.42893 | 7187 | 0.3258 | 0.346 | 25.4 | 0.026 |

|  | R | | G | | B | | W | | Panel Eff. | |
| --- | --- | --- | --- | --- | --- | --- | --- | --- | --- | --- |
|  | cd/A | mA/cm2 | cd/A | mA/cm2 | cd/A | mA/cm2 | cd/A | cd/A | Color Reproduction Rate | |
| Broad | 7.1 | 22.5 | 26 | 24.9 | 3.48 | 17.6 | 83.18 | 31.10 | 119.8 | |
| Narrow | 7.1 | 19.6 | 25 | 26.7 | 3.48 | 17.6 | 87.61 | 28.97 | 115 | |

| λ max | R | | G | | B | | W | Panel Eff. | |
|---|---|---|---|---|---|---|---|---|---|
| | cd/A | mA/cm2 | cd/A | mA/cm2 | cd/A | mA/cm2 | cd/A | cd/A | Color Reproduction Rate |
| 540 | 3.87 | 53.6 | 35.61 | 16 | 4.84 | 15.7 | 87.13 | 16.28 | 115.7 |
| 564 | 7.08 | 22.5 | 25.77 | 24.9 | 3.48 | 17.6 | 83.18 | 31.10 | 119.8 |
| 575 | 8.94 | 14.9 | 19.68 | 34.8 | 3.12 | 16.4 | 76.78 | 23.58 | 119.7 |

ORGANIC LIGHT EMITTING DISPLAY DEVICE

CROSS-REFERENCE TO RELATED APPLICATIONS

This application claims the benefit of the Korean Patent Application No. 10-2011-0141810 filed on Dec. 23, 2011 and 10-2012-0108375 filed on Sep. 27, 2012, which is hereby incorporated by reference as if fully set forth herein.

BACKGROUND

1. Field of the Invention

The present invention relates to an organic light emitting display device, and more particularly, to an organic light emitting display device for improving a color viewing angle.

2. Discussion of the Related Art

Generally, light emitting devices are categorized into organic light emitting display devices that have an emission layer formed of an organic material and inorganic light emitting display devices that have an emission layer formed of an inorganic material. In such light emitting devices, the organic light emitting display devices are self-emitting devices in which, an electron injected from a cathode and a hole injected from an anode are combined with each other in an organic emission layer to form an exiton, and the exiton releases energy to emit light. The organic light emitting display devices are driven with low power, self-emit light, realize a natural color, and have a wide viewing angle, high resolution, and a fast response time.

Recently, as organic light emitting display devices emitting white light are developed, the organic light emitting display devices are widely applied to various fields such as backlight, lighting, etc., and thus are recognized as a most important type of display device.

In types where the organic light emitting display devices realize white, there are a single-photon emission type, a multi-photon emission type, a color conversion type, and a stack type. Among such types, the multi-photon emission type in which light is emitted from a multi-layer and white is realized by vertical combination of colors is widely used.

Specifically, as shown in FIG. 1, organic light emitting display devices based on the multi-photon emission type having a 2-stack structure externally emit electroluminescent (EL) spectrum light having two peaks However, the above-described organic light emitting display devices of the related art have the following limitations.

FIG. 1 is a view showing an EL spectrum and an emittance spectrum that are changed according to a viewing angle, and a photoluminescence (PL) spectrum that is hardly changed according to the viewing angle, in a related art organic light emitting display device. FIG. 2 is a view showing that the intensities of blue light B and yellowish green light YG are reduced according to a viewing angle, in the related art organic light emitting display device of FIG. 1.

As seen in FIG. 1, an EL spectrum 30 in which final light emitted from the related art organic light emitting display device has been spectrum-analyzed is expressed as the multiplication of a PL spectrum 10 (which is a spectrum of light emitted from an emission layer) and an emittance spectrum 20 that is changed according to the optical characteristic and thickness of a layer configuring an organic emission layer.

As seen in the PL spectrum 10, the related art organic light emitting display device includes an emission layer that emits (B PL) the peak wavelength of blue, and an emission layer that emits (YG PL) the peak wavelength of yellowish green, thereby emitting white light. However, since an amount of reduced intensity of blue light differs from an amount of reduced intensity of yellowish green light, the white light is reduced in color viewing angle characteristic.

That is, as seen in the EL spectrum 30 and FIG. 2, as a viewing angle increases from 0 degrees to 60 degrees, the intensity of blue light is rapidly reduced, but the intensity of yellowish green is relatively slowly reduced. For this reason, in a difference between white light realized in the front (a viewing angle of 0 degrees) and white light realized in a side surface, color shift increases (the reduction in color viewing angle characteristic) progressively closer to a side surface (the increase in a viewing angle).

Moreover, as seen in the EL spectrum 30, it can be seen that the intensity of red (R) light is lower than those of blue light and green light. Therefore, the current density of a red sub-pixel increases for realizing sufficient luminance, and thus, a Voled voltage increases and the light emission efficiency of a panel decreases.

SUMMARY

Accordingly, the present invention is directed to an organic light emitting display device that substantially obviates one or more problems due to limitations and disadvantages of the related art.

An aspect of the present invention is directed to an organic light emitting display device for improving color viewing angle characteristic and the light emission efficiency of a panel.

Another aspect of the present invention is directed to an organic light emitting display device with an improved color reproduction rate.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display device including: a substrate; a thin film transistor formed on the substrate; a first electrode formed on the thin film transistor; an organic emission layer including a first stack that includes a first emission layer formed on the first electrode to emit first color light, a second stack that includes a second emission layer formed on the first electrode to emit second color light, and a charge generation layer formed between the first and second stacks; and a second electrode formed on the organic emission layer, wherein, a first-color peak wavelength (first peak wavelength) of a photoluminescence (PL) spectrum determined depending on dopant characteristics of the first and second emission layers is disposed in a short-wavelength area compared to a first-color peak wavelength (second peak wavelength) of an emittance spectrum determined depending on optical characteristic of an organic light emitting device, and, a second-color peak wavelength (third peak wavelength) of the PL spectrum is disposed in a short or long wavelength area compared to a second-color peak wavelength (fourth peak wavelength) of the emittance spectrum.

In the organic light emitting display device, a difference between the first-color peak wavelength (the first peak wavelength) of the PL spectrum and the first-color peak wavelength (the second peak wavelength) of the emittance spectrum may be equal to or less than 10 nm, and, a difference between the second-color peak wavelength (the third peak wavelength) of the PL spectrum and the second-color peak wavelength (the fourth peak wavelength) of the emittance spectrum may be equal to or less than ±10 nm.

The first color may be blue, and the second color may be yellowish green.

In the organic light emitting display device, a dopant concentration of the second emission layer may be 10% to 25% of a host.

In the organic light emitting display device, a dopant material of the second emission layer may be selected for the second-color peak wavelength (the third peak wavelength) of the PL spectrum to have a wavelength of 540 nm to 575 nm.

In the organic light emitting display device, a color-coordinate change amount (Δu'v') in CIE 1931 standard colorimetric system may be equal to or less than 0.02 in a viewing angle direction of 0 degrees to 60 degrees of light emitted from the organic light emitting display device.

The organic light emitting display device may further include an overcoat layer and a light compensation layer between the thin film transistor and the first electrode.

The light compensation layer may have a refractive index of 1.8 to 2.3.

The light compensation layer may have a thickness of 1100 Å to 2500 Å.

In the organic light emitting display device, a full width at half maximum of the second-color peak wavelength (the third peak wavelength) of the PL spectrum may be equal to or greater than 80 nm.

In the organic light emitting display device, a peak wavelength of the second-color peak wavelength (the third peak wavelength) of the PL spectrum may be 540 nm to 575 nm.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 9 is a view showing characteristic which has been analyzed after the doping amount of the yellowish green dopant increases by 14% and 20%, in an organic light emitting display device according to an embodiment of the present invention including a light compensation layer having a thickness of 2200 Å;

FIG. 12 is a view showing characteristic which has been analyzed after the doping amount of the yellowish green dopant increases by 14% and 20%, in an organic light emitting display device according to an embodiment of the present invention having no light compensation layer;

DETAILED DESCRIPTION OF THE INVENTION

Reference will now be made in detail to the exemplary embodiments of the present invention, examples of which are illustrated in the accompanying drawings Wherever possible, the same reference numbers will be used throughout the drawings to refer to the same or like parts.

Hereinafter, an organic light emitting display device according to an embodiment of the present invention will be described in detail with reference to the accompanying drawings.

In description of embodiments of the present invention, when a structure is described as being formed at an upper portion/lower portion of another structure or on/under the other structure, this description should be construed as including a case where the structures contact each other and moreover a case where a third structure is disposed therebetween.

Figure 1:
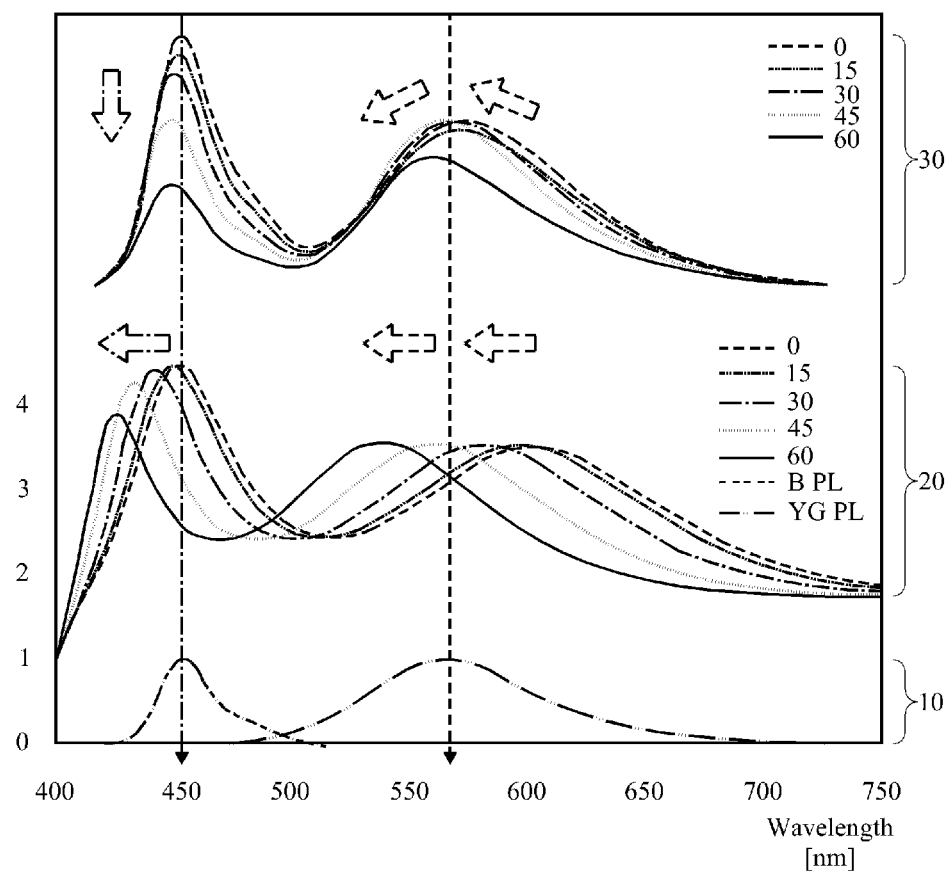
FIG. 1 is a view showing an EL spectrum and an emittance spectrum that are changed according to a viewing angle, and a photoluminescence (PL) spectrum that is hardly changed according to the viewing angle, in a related art organic light emitting display device.
Figure 2:
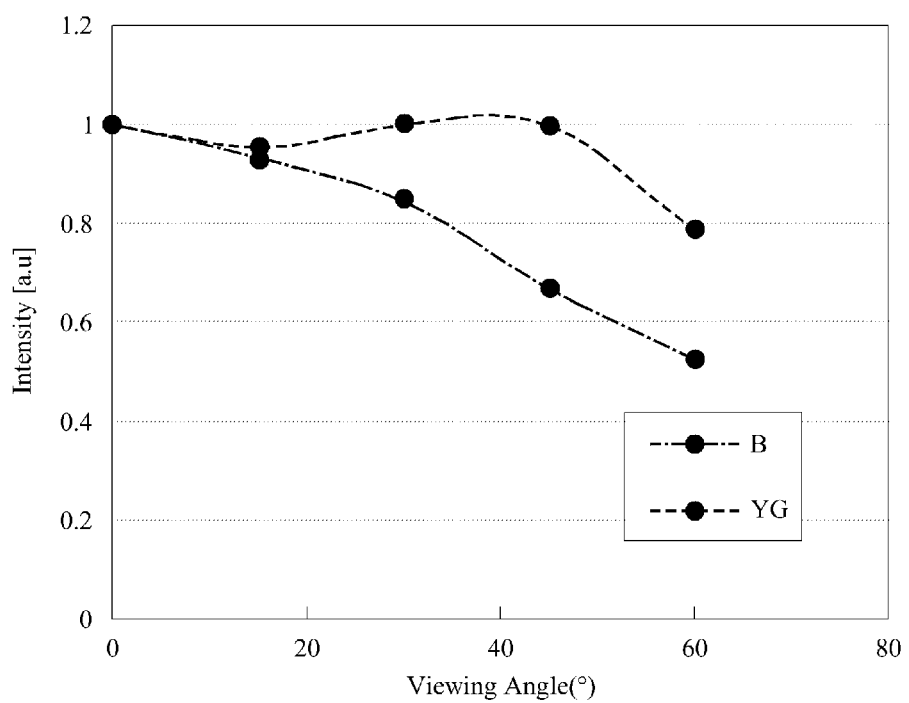
FIG. 2 is a view showing that the intensities of blue light B and yellowish green light YG are reduced according to a viewing angle, in the related art organic light emitting display device of FIG. 1.
Figure 3:
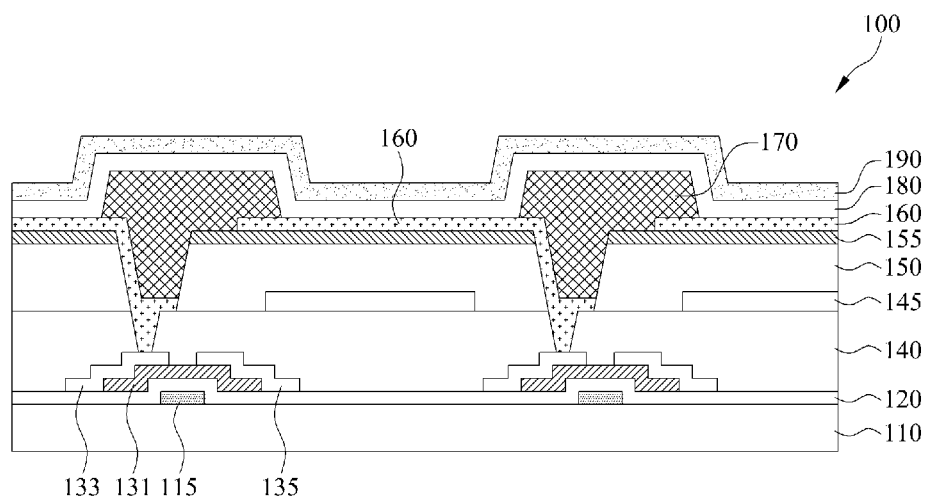
FIG. 3 is a sectional view illustrating an organic light emitting display device according to an embodiment of the present invention.
Figure 4:
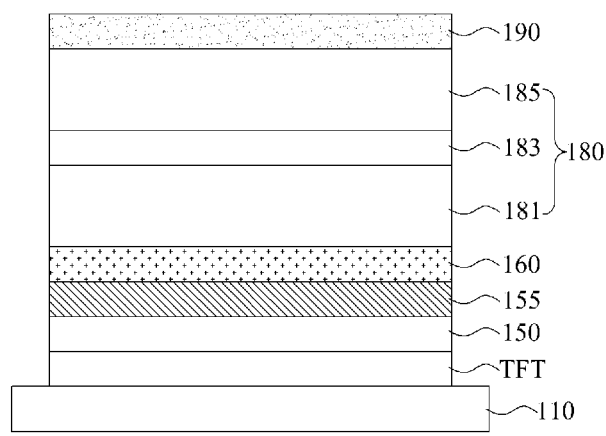
FIG. 4 is a view illustrating a structure of an organic emission layer of the organic light emitting display device according to an embodiment of the present invention.

FIG. 3 is a sectional view illustrating an organic light emitting display device according to an embodiment of the present invention. FIG. 4 is a view illustrating a structure of an organic emission layer of the organic light emitting display device according to an embodiment of the present invention.

As seen in FIG. 3, an organic light emitting display device 100 according to an embodiment of the present invention includes a substrate 110, a thin film transistor (TFT), a overcoat layer 150, a light compensation layer 155, a first electrode 160, a bank layer 170, an organic emission layer 180, and a second electrode 190. Here, the TFT includes a gate electrode 115, a gate insulator 120, a semiconductor layer 131, a source electrode 133, a drain electrode 135, a first passivation layer 140, a color filter 145, the overcoat layer 150, the light compensation layer 155, the first electrode 160, the bank layer 170, the organic emission layer 180, and the second electrode 190.

The substrate 110 may be formed of glass or transparent plastic.

The gate electrode 115 is formed on the substrate 110, and connected to a gate line (GL). The gate electrode 115 may be a multilayer formed of one selected from the group consisting of Mo, Al, Cr, Au, Ti, Ni, Nd, and Cu, and an alloy thereof.

The gate insulator 120 is formed on the gate electrode 113, and may be silicon oxide (SiOx), silicon nitride (SiNx), or a multilayer thereof. However, the gate insulator 110 is not limited thereto.

The semiconductor layer 131 is formed on the gate insulator 120, and may include amorphous silicon or polycrystalline silicon in which the amorphous silicon is crystallized. The etch stopper 132 may be formed on the semiconductor layer 131, and protect the semiconductor layer 131. However, the etch stopper 132 may not be provided depending on the case.

The source electrode 133 and the drain electrode 135 may be formed on the semiconductor layer 131. The source electrode 133 and the drain electrode 135 may be formed in a single layer or a multilayer. The source electrode 133 and the drain electrode 135 may be formed of one selected from the group consisting of Mo, Al, Cr, Au, Ti, Ni, Nd, and Cu, and an alloy thereof.

The first passivation layer 140 may be formed on the source electrode 133 and the drain electrode 135, and may be SiOx, SiNx, or a multilayer thereof. However, the first passivation layer 140 is not limited thereto.

The color filter 145 is formed in a red sub-pixel area, a blue sub-pixel area, and a green sub-pixel area, on the first passivation layer 140. The color filter 145 converts white light, emitted from an OLED, into red (R), blue (B), and green (G) light.

The overcoat layer 150 may be formed on the color filter 145, and may be acryl-based resin, polyimide resin, SiOx, SiNx, or a multilayer thereof. However, the second passivation layer 160 is not limited thereto.

The light compensation layer 155 may be formed on the overcoat layer 150, and formed of SiOx or SiNx, or in a multilayer thereof.

Especially, the light compensation layer 155 is formed of a material having a refractive index of 1.8 to 2.3, and has a thickness of 1100 Å to 2500 Å, thus enhancing the color viewing angle characteristic and light emission efficiency of the organic light emitting display device 100.

The first electrode 160 may be formed on the light compensation layer 155, and formed of transparent indium tin oxide (ITO) or indium zinc oxide (IZO). However, the anode electrode 170 is not limited thereto. The first electrode 160 is electrically connected to the source electrode 133. To this end, a contact hole is formed in a certain region of the first passivation layer 140, and a contact hole is formed in a certain region of the overcoat layer 150. The first electrode 160 may be an anode.

The bank layer 170 may be formed on the first electrode 160, and include an organic material such as benzocyclobutene (BCB)-based resin, acryl-based resin, or polyimide resin. The bank layer 170 is formed on the first electrode 160 to have a certain opening such that light emitted from the organic emission layer 180 is transmitted.

The organic emission layer 180 is formed on the bank layer 170, and emits white light. Referring to FIG. 4 for providing a detailed description on this, the organic emission layer 180 includes a first stack 181 formed on the first electrode 160, a charge generation layer (CGL) 183 formed on the first electrode 160, and a second stack 185 formed on the first electrode 160.

In FIG. 4, the second stack 185 is illustrated as being formed on the first stack 181, but is not limited thereto. As another example, the first stack 181 may be formed on the second stack 185.

The first stack 181 is formed on the first electrode 160, and includes a first emission layer emitting blue light. The first stack 181 includes an electron injection layer (EIL), an electron transport layer (ETL), a first emission layer (EML), a hole transport layer (HTL), and a hole injection layer (HIL), which may be stacked in a multilayer.

The second stack 182 is formed on the first electrode 160, and includes a second emission layer emitting yellowish green light. The second stack 185 includes an EIL, an ETL, a second EML, an HTL, and an HIL, which may be stacked in a multilayer.

In this case, a thickness of the light compensation layer 155, first electrode 160, and organic emission layer 180 is a factor for determining an emittance spectrum of the organic light emitting display device, and may be set as expressed in the following Equation (1).

$$\sum_i \frac{n_i^o d_i^o}{\lambda_b} + \frac{n^a d^a}{\lambda_b} + \sum_j \frac{n_j^w d_j^w}{\lambda_b} = 1.85 \sim 2.15 \quad (1)$$

where a first-order term is relevant to the light compensation layer 155, a second-order term is relevant to the first electrode 160, a third-order term is relevant to the organic emission layer 180, n denotes a refractive index, d denotes a distance from a cathode to an emission layer, and λ denotes the peak wavelength of blue light.

The distance from the cathode to the emission layer may be determined as expressed in the following Equation (2).

$$\frac{(2m-1)\lambda}{4} = nd \quad (2)$$

where m denotes a positive number, n denotes a refractive index, d denotes the distance from the cathode to the emission layer, λ denotes the peak wavelength of blue light or yellowish green light.

The CGL is formed between the first and second stacks 181 and 185.

When a driving voltage is applied to the first and second electrodes 160 and 190, a hole passing through the HTL and an electron passing through the ETL move to each of the EMLs (first and second EMLs) to generate an exciton, and thus, the EMLs (first and second EMLs) emit visible light.

Light emitted from each of the first and second EMLs is emitted as white light in the outside of the organic emission layer 180.

In this case, the emitted white light passes through the color filter 145 and is externally transferred toward the substrate 110. At this point, light passing through a red color filter is converted into red light, light passing through a blue color filter is converted into blue light, and light passing through a green color filter is converted into green light.

Hereinafter, the characteristic of light emitted from the organic emission layer 180 will be described in detail with reference to FIG. 5.

Figures 5, 6:
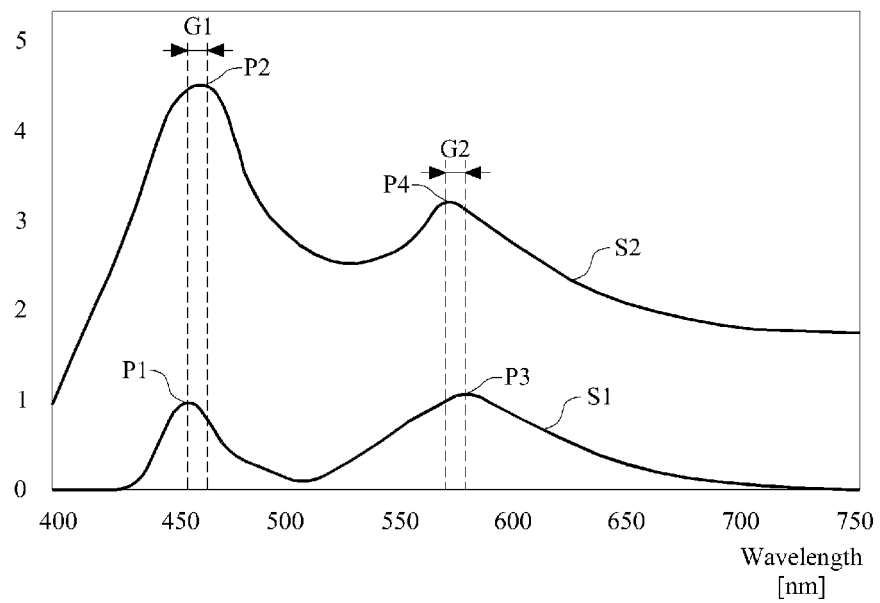
FIG. 5 is a view showing a PL sprectrumg and emittance spectrum of the organic light emitting display device according to an embodiment of the present invention.
FIG. 6 is a view showing characteristic which has been analyzed after a doping amount of a yellowish green dopant increases by 14% and 20%, in an organic light emitting display device according to an embodiment of the present invention including a light compensation layer having a thickness of 1600 Å.

FIG. 5 is a view showing a PL sprectrumg and emittance spectrum of the organic light emitting display device according to an embodiment of the present invention.

As seen in FIG. 5, a PL spectrum S1 of the organic light emitting display device according to the present invention includes a first peak wavelength P1 and a third peak wavelength P3. Also, an emittance spectrum S2 includes a second peak wavelength P2 and a fourth peak wavelength P4.

In the PL spectrum S1, the first peak wavelength P1 denotes the peak wavelength of the first color emitted from the first EML, and the second peak wavelength P2 denotes the peak wavelength of the second color emitted from the second EML.

In the emittance spectrum S2, the second peak wavelength P2 denotes the peak wavelength of the first color, and the fourth peak wavelength P4 denotes the peak wavelength of the second color.

Here, the PL spectrum (emission spectrum) is a spectrum in which light emitted from the EML has been analyzed, and denotes a spectrum that has unique feature depending on the characteristic of a dopant doped into the EML, namely, the unique feature and doping amount of the dopant.

The emittance spectrum denotes a spectrum that has unique feature depending on the optical characteristics (thickness and refractive index) of a layer (configuring the organic emission layer) and the light compensation layer. To provided a detailed description on this, the emittance spectrum may be measured in consideration of the optical characteristics of the layer (configuring the organic emission layer) and the light compensation layer and the optical characteristics of the organic light emitting display device.

Here, the optical characteristic of the organic light emitting display device denote characteristics such as thickness and refractive index of each of elements disposed on all paths through which light emitted from the organic emission layer passes. Elements, disposed on all paths through which light emitted from the organic emission layer passes, may include an overcoat layer, color filter, a passivation layer, a TFT layer, a substrate, and a sealing layer as well as the organic emission layer and the light compensation layer.

Moreover, an EL spectrum denotes a spectrum in which the spectrum of light finally outputted from the organic light emitting display device has been analyzed, and is affected by the characteristics of the PL spectrum and the emittance spectrum.

The emittance spectrum may be changed by adjusting the thickness of the layer of the organic emission layer and the thickness of the light compensation layer, thereby changing the second peak wavelength P2 and the fourth peak wavelength P4.

The emittance spectrum may be changed by adjusting the optical characteristics (thickness and refractive index) of the layer of the organic emission layer and the light compensation layer, thereby changing the second peak wavelength P2 and the fourth peak wavelength P4. In this case, the second peak wavelength P2 and fourth peak wavelength P4 in the emittance spectrum are simultaneously changed by adjusting the optical characteristics (thickness and refractive index) of the layer of the organic emission layer and the light compensation layer, and thus, the appropriate adjustment of the optical characteristics is needed.

The first peak wavelength P1 in the PL spectrum may be moved by adjusting the doping amount of the dopant of the first EML or changing a material of the dopant, and the third peak wavelength P3 in the PL spectrum may be moved by adjusting the doping amount of the dopant of the second EML or changing a material of the dopant.

In the organic light emitting display device, to enhance a color viewing angle and panel efficiency, a first-color peak wavelength (first peak wavelength P1) of the PL spectrum S1 determined depending on the dopant characteristics of the first and second EMLs is disposed in a short-wavelength area compared to a first-color peak wavelength (second peak wavelength P2) in the emittance spectrum S2 determined depending on the optical characteristics of the layer of the organic emission layer and the light compensation layer, and, a second-color peak wavelength (third peak wavelength P3) in the PL spectrum S1 is disposed in a short or long wavelength area compared to a second-color peak wavelength (fourth peak wavelength P4) in the emittance spectrum S2.

This is because when the first peak wavelength P1 is matched with the second peak wavelength P2 and simultaneously the third peak wavelength P3 is matched with the fourth peak wavelength P4, a rate of decrease in intensity of first color light is greater than a rate of decrease in intensity of first color light, and thus, as a viewing angle increases, color shift increases and color viewing angle characteristic is reduced.

Therefore, by designing the first peak wavelength P1 shorter than the second peak wavelength P2 and designing the third peak wavelength P3 shorter or longer than the fourth peak wavelength P4, the present invention suppresses color shift caused by the increase in a viewing angle, thus improving color viewing angle characteristic.

In this case, a difference between the first and second peak wavelengths P1 and P2 may be equal to or less than 10 nm, and a difference between the third and fourth peak wavelengths P3 and P4 may be designed to less than ±10 nm. However, the present invention is not limited thereto.

A dopant concentration of the second EML may be 10% to 25% of a host.

In this case, when the dopant concentration of the second EML is less than 10% compared to the host, the third peak wavelength P3 is shorter than the fourth peak wavelength P4. In this case, the analysis of the EL spectrum shows that the change (caused by the increase in a viewing angle) in intensity of second color light increases slightly and then decreases. On the other hand, since the change (caused by the increase in a viewing angle) in intensity of first color light increases continuously, an intensity change difference between the first color light and the second color light is large, and thus, it is difficult to improve a color viewing angle.

Moreover, when the dopant concentration of the second EML exceeds 25% compared to the host, the third peak wavelength P3 becomes longer than the fourth peak wavelength P4, and thus, color viewing angle characteristic is improved, but intensity of the second color light decreases. In this case, although intensity of red light increases slightly, since intensity of the second color light decreases, the light emission efficiency of a panel decreases overall, and consumption power increases.

The dopant material of the second EML may be selected in order for the third peak wavelength P3 of the PL spectrum to have a wavelength of 540 nm to 575 nm.

That is, in order for the second EML to emit the third peak wavelength P3 moving to a wavelength shorter or longer than the fourth peak wavelength P4 in the emittance spectrum of the organic emission layer 180, the dopant concentration of the second EML may increase by 10% to 25%, or a dopant having a relatively long wavelength (wavelength of 540 nm to 575 nm) may be used.

The first color may be blue, and the second color may be yellowish green, but are not limited thereto. Hereinafter, the first color will be described as blue, and the second color will be described as yellowish green.

A color-coordinate change amount (Δu'v') in the commission internationale de l'eclairage (CIE) 1931 standard colorimetric system becomes equal to or less than 0.02 in a viewing angle direction of 0 degrees to 60 degrees of light emitted from the organic light emitting display device. In this case, the color-coordinate change amount is defined as a color-coordinate difference between initial color coordinates (u'0, v'0) and color coordinates (u't, v't) after a certain time "t" elapses, according to the CIE 1931 standard colorimetric system (u', v').

When a color-coordinate change amount becomes equal to or less than 0.02, a user cannot perceive color shift due to a viewing angle well.

As described above, when the first peak wavelength P1 is designed shorter than the second peak wavelength P2 and the third peak wavelength P3 is designed shorter or longer than the fourth peak wavelength P4, matching between the PL spectrum and the emittance spectrum is improved, and therefore, color shift due to the increase in a viewing angle is reduced, thus enhancing color viewing angle characteristic. Also, the light emission efficiency of red light in the EL spectrum is enhanced, and therefore, a Voled voltage decreases, thus improving the light emission efficiency of the panel.

In this case, the Voled voltage is a voltage applied to the first electrode (anode) and the second electrode (cathode), and denotes a voltage applied to a sub-pixel showing the highest current density among RGBW sub-pixels.

In the organic light emitting display device, the full width at half maximum (FWHM) of the second-color peak wavelength (third peak wavelength) in the PL spectrum is formed to greater than 80 nm, for enhancing a color reproduction rate and light emission efficiency. Here, the FWHM denotes a wavelength range at an amplitude corresponding to ½ of the peak of a spectrum.

In an embodiment, the second color may be yellowish green (YG). A yellowish green spectrum is used to realize RGB channels including red and green channels, and thus, when the FWHM of the second-color peak wavelength increases, the light emission efficiency of the red and green channels increases, thus enhancing a color reproduction rate.

In an embodiment, the FWHM of the second-color peak wavelength may be formed to greater than 80 nm. Also, even though having the same FWHM, the light emission efficiency of the red and green channels may largely vary depending on a peak wavelength value, in which case a wavelength may be formed to have a value of 540 nm to 575 nm (an experiment on this will be described in an experiment example 4).

As described above, a method of using a dopant having a wide FWHM, a method of adjusting a doping ratio, and a method of using an EML having a multi-layer structure may be used for realizing a spectrum having an enlarged FWHM in the second-color peak wavelength.

Referring again to FIG. 3, the second electrode 190 may be formed on the organic emission layer 180, and may use a metal material such as Al, Ca, or Mg, or a transparent material such as indium tin oxide (ITO) or indium zinc oxide (IZO). In this case, the second electrode 190 may be the cathode.

Hereinafter, a result of an experiment example on the organic light emitting display device according to the present invention will be described.

Experiment Example 1

FIG. 6 is a view showing characteristic which has been analyzed after a doping amount of a yellowish green dopant increases by 14% and 20%, in an organic light emitting display device according to an embodiment of the present invention including a light compensation layer having a thickness of 1600 Å.

As seen in FIG. 6, the light compensation layer has been formed to have a thickness of 1600 Å, an HTL1 has been formed to have a thickness of 1250 Å, an HL3 has been formed to have a thickness of 350 Å, and an ETL2 has been formed to have a thickness of 450 Å. Also, doping has been performed with the yellowish green dopant in order for the doping amount of the yellowish green dopant to become 14% and 20% compared to the host.

When the doping amount of the yellowish green dopant is 20% compared to the host, it can be seen that panel efficiency increases, the Voled value decreases, and a color-coordinate change amount decreases, compared to a case in which the doping amount of the yellowish green dopant is 14% compared to the host.

Figure 7:
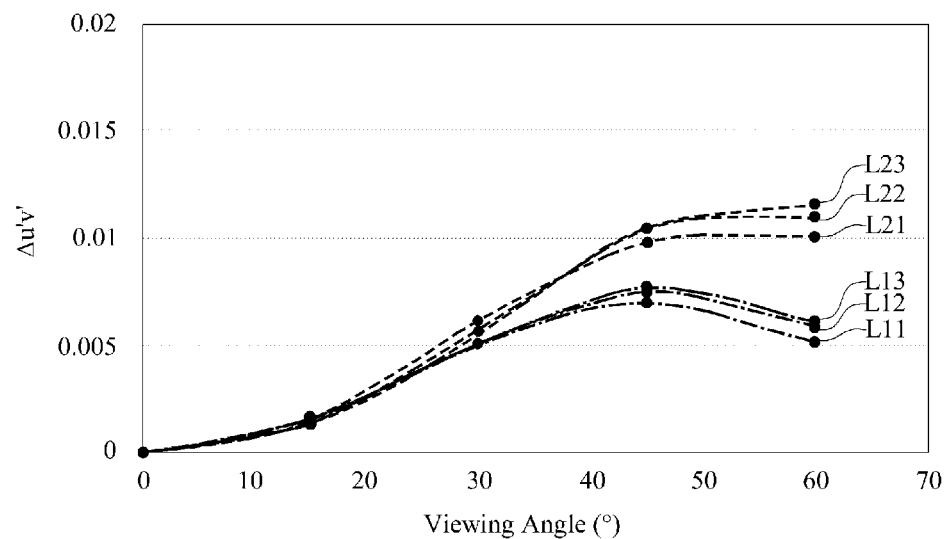
FIG. 7 is a view showing a color-coordinate change amount with respect to a viewing angle, in an experiment example 1 of FIG. 6.

FIG. 7 is a view showing a color-coordinate change amount with respect to a viewing angle, in the experiment example 1 of FIG. 6.

As seen in FIG. 7, doping has been performed with the yellowish green dopant in order for the doping amount of the yellowish green dopant to become 20% compared to the host, a color-coordinate change amount has been analyzed three times, and the analyzed results are shown as L11, L12, and L13. Also, doping has been performed with the yellowish green dopant in order for the doping amount of the yellowish green dopant to become 14% compared to the host, a color-coordinate change amount has been analyzed three times, and the analyzed results are shown as L21, L22, and L23.

When the doping amount of the yellowish green dopant is 20% compared to the host, it can be seen that a color-coordinate change amount decreases, and color viewing angle characteristic is improved, compared to a case in which the doping amount of the yellowish green dopant is 14% compared to the host.

Figure 8:
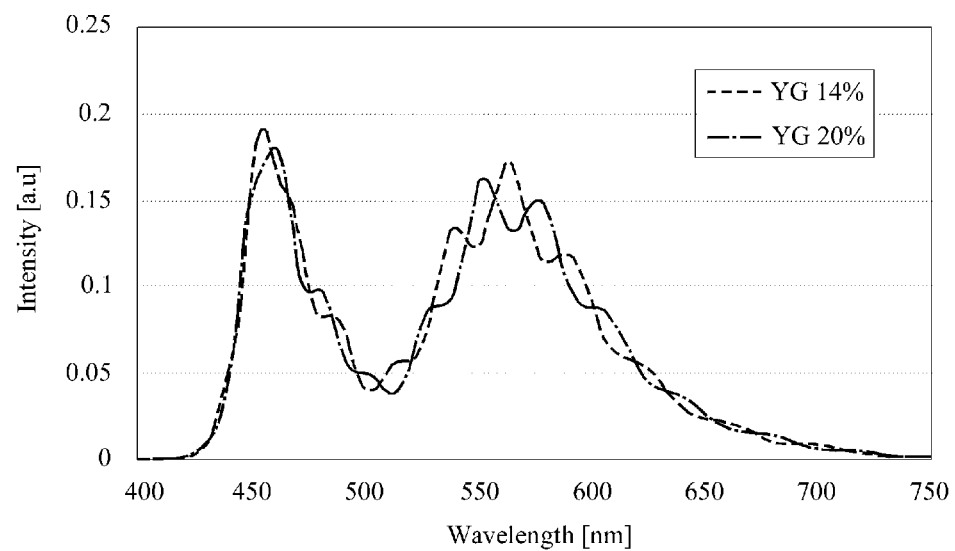
FIG. 8 is a view showing an EL spectrum based on a doping amount, in the experiment example 1 of FIG. 6.

FIG. 8 is a view showing an EL spectrum based on a doping amount, in the experiment example 1 of FIG. 6.

When doping is performed with the yellowish green dopant in order for the doping amount of the yellowish green dopant to increase by 20% and 14% compared to the host, the EL spectrum moves to a long wavelength, and therefore, the light emission efficiency of red light is enhanced and the Voled voltage decreases, thus improving the light emission efficiency of the panel.

Experiment Example 2

FIG. 9 is a view showing characteristic which has been analyzed after the doping amount of the yellowish green dopant increases by 14% and 20%, in an organic light emitting display device according to an embodiment of the present invention including a light compensation layer having a thickness of 2200 Å.

As seen in FIG. 9, the light compensation layer has been formed to have a thickness of 2200 Å, an HTL1 has been formed to have a thickness of 600 Å, an HL3 has been formed to have a thickness of 450 Å, and an ETL2 has been formed to have a thickness of 450 Å. Also, doping has been performed in order for the doping amount of the yellowish green dopant to become 20% (a) and 14% (b) compared to the host.

When the doping amount of the yellowish green dopant is 20% (a) compared to the host, it can be seen that panel efficiency increases, the Voled value decreases, and a color-coordinate change amount decreases, compared to a case in which the doping amount of the yellowish green dopant is 14% (b) compared to the host.

Figure 10:
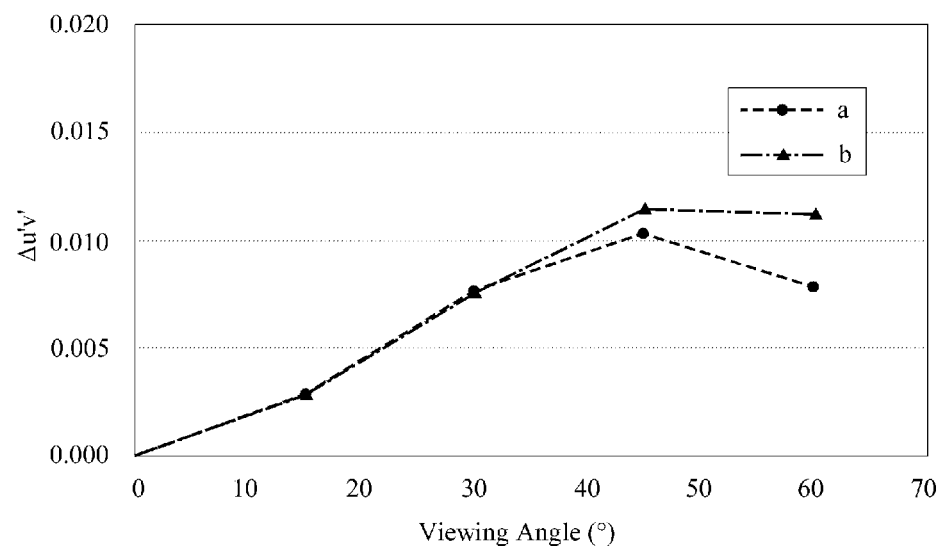
FIG. 10 is a view showing a color-coordinate change amount with respect to a viewing angle, in an experiment example 2 of FIG. 9.

FIG. 10 is a view showing a color-coordinate change amount with respect to a viewing angle, in the experiment example 2 of FIG. 9.

As seen in FIG. 10, when the doping amount of the yellowish green dopant is 20% (a) compared to the host, it can be seen that a color-coordinate change amount decreases, and color viewing angle characteristic is improved, compared to a case in which the doping amount of the yellowish green dopant is 14% (b) compared to the host.

Figure 11:
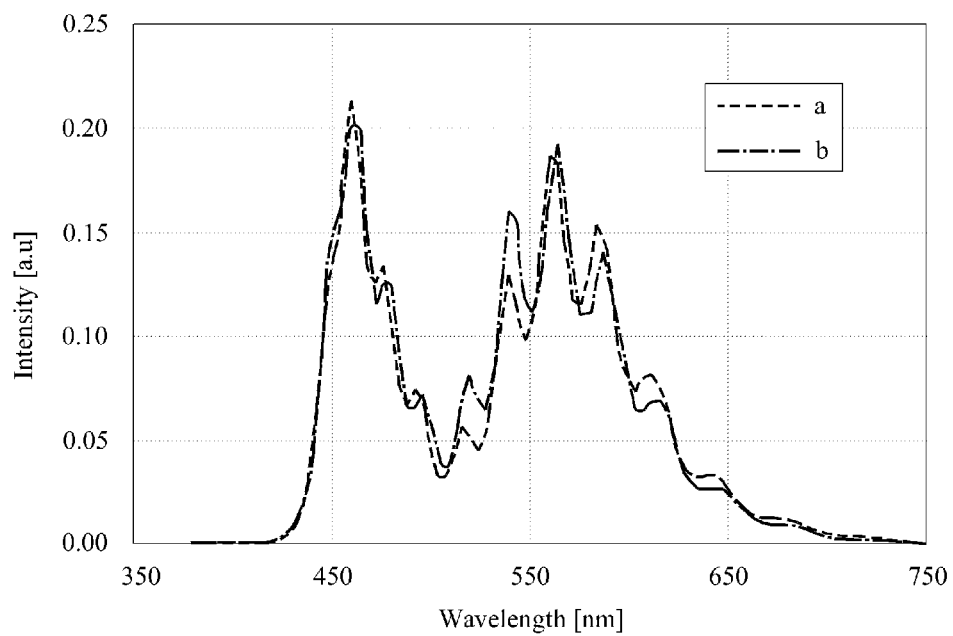
FIG. 11 is a view showing an EL spectrum based on a doping amount, in the experiment example 2 of FIG. 9.

FIG. 11 is a view showing an EL spectrum based on a doping amount, in the experiment example 2 of FIG. 9.

As seen in FIG. 11, when the doping amount of the yellowish green dopant increases by 20% (a) and 14% (b) compared to the host, the peak wavelength of a yellowish green wavelength moves to a long wavelength in the EL spectrum, thereby leading to the change in the EL spectrum. Accordingly, the light emission efficiency of red light is enhanced, and the Voled voltage decreases, thus improving the light emission efficiency of the panel.

Experiment Example 3

FIG. 12 is a view showing characteristic which has been analyzed after the doping amount of the yellowish green dopant increases by 14% and 20%, in an organic light emitting display device according to an embodiment of the present invention having no light compensation layer.

As seen in FIG. 12, the light compensation layer is not formed, and doping has been performed in order for the doping amount of the yellowish green dopant to become 14% and 20% compared to the host.

when the doping amount of the yellowish green dopant is 20% compared to the host, it can be seen that panel efficiency increases slightly, the Voled value decreases, and a color-coordinate change amount decreases, compared to a case in which the doping amount of the yellowish green dopant is 14% compared to the host.

Figure 13:
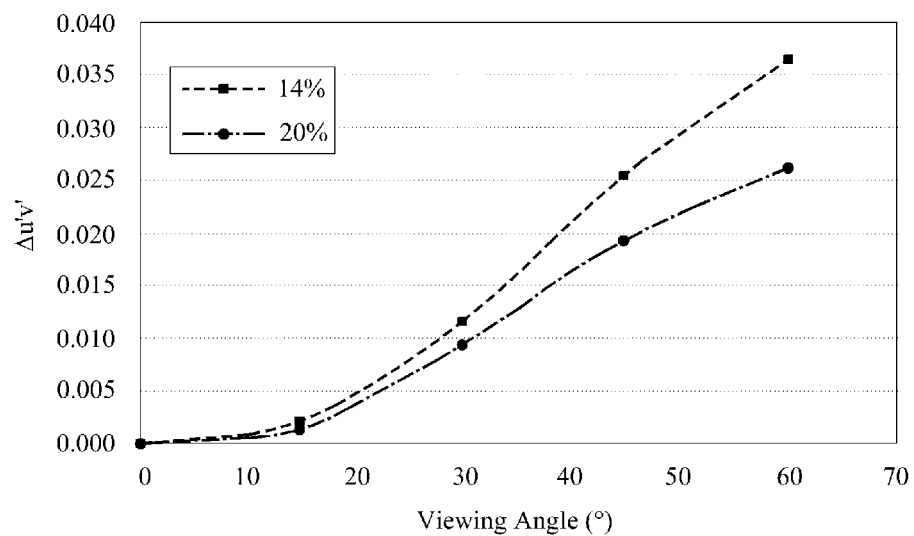
FIG. 13 is a view showing a color-coordinate change amount with respect to a viewing angle, in an experiment example 3 of FIG. 12.

FIG. 13 is a view showing a color-coordinate change amount with respect to a viewing angle, in the experiment example 3 of FIG. 12.

As seen in FIG. 13, when the doping amount of the yellowish green dopant is 20% compared to the host, it can be seen that a color-coordinate change amount decreases, and color viewing angle characteristic is improved, compared to a case in which the doping amount of the yellowish green dopant is 14% compared to the host.

Figure 14:
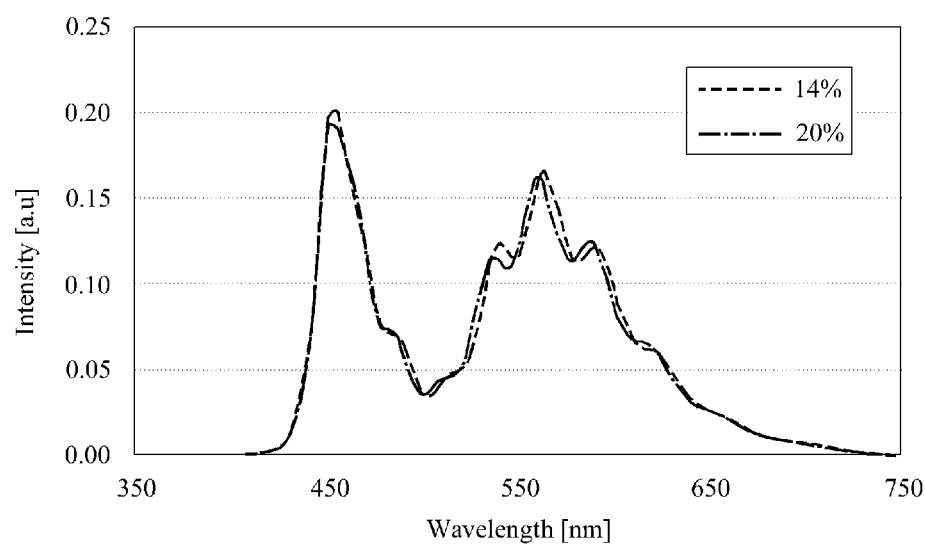
FIG. 14 is a view showing an EL spectrum based on a doping amount, in the experiment example 3 of FIG. 12.

FIG. 14 is a view showing an EL spectrum based on a doping amount, in the experiment example 3 of FIG. 12.

As seen in FIG. 14, when the doping amount of the yellowish green dopant increases by 20% and 14% compared to the host, the peak wavelength of a yellowish green wavelength moves to a long wavelength in the EL spectrum, thereby leading to the change in the EL spectrum. Accordingly, the light emission efficiency of red light is enhanced, and the Voled voltage decreases, thus improving the light emission efficiency of the panel.

Experiment Example 4

Figures 15, 16:
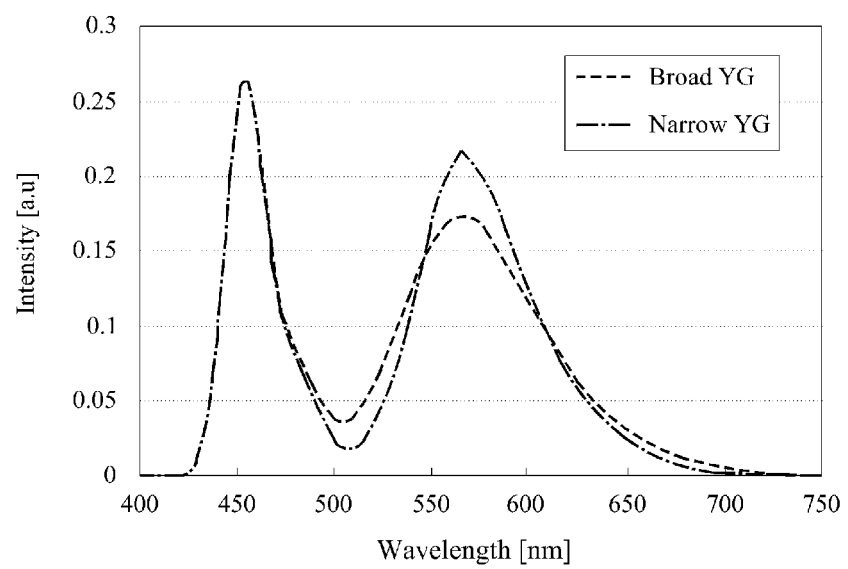
FIG. 15 is a view showing an amount of changed intensity based on the change in a full width at half maximum of a PL spectrum.
FIG. 16 is a chart showing an experiment result in which a current density and intensity per unit area of the spectrum of FIG. 15 have been measured in R, G, and B channels.

FIG. 15 is a view showing an amount of changed intensity based on the change in the FWHM of the PL spectrum. In FIG. 15, the abscissa axis indicates a wavelength (nm), and the ordinate axis indicates intensity (a.u).

As seen in FIG. 15, an area corresponding to a YG peak in a PL spectrum (broad YG) having an enlarged FWHM shows high intensity in a red area and a green area compared to a PL spectrum (narrow YG) having a narrow FWHM.

FIG. 16 is a chart showing an experiment result in which a current density and intensity per unit area of the spectrum of FIG. 15 have been measured in R, G, and B channels.

As seen in FIG. 16, in the PL spectrum (broad YG) having the enlarged FWHM, the light emission efficiency (cd/A) of the red (R) channel has not been changed, the current density ($mA/cm^2$) of the red (R) channel has increased, the light emission efficiency (cd/A) of the green (G) channel has increased, and the current density ($mA/cm^2$) of the green (G) channel has increased. Also, in overall panel efficiency, light emission efficiency (cd/A) has overall increased from 28.97 to 31.10, and a color reproduction rate has increased from 115 to 119.8.

Figures 17, 18:
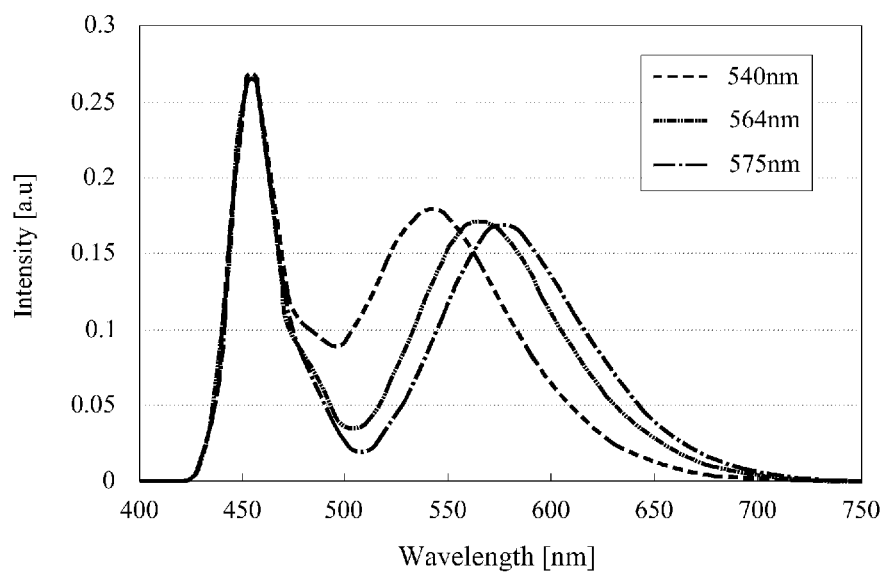
FIG. 17 is a view showing an amount of changed intensity based on the change in the YG peak wavelength.
FIG. 18 is a chart in which, after the spectrum of FIG. 17 passes through a color filter CF, efficiency and a current density based on the change in the peak intensity of each of R, G, and B channels have been analyzed.

FIG. 17 is a view showing an amount of changed intensity based on the change in the YG peak wavelength. In FIG. 17, the abscissa axis indicates a wavelength (nm), and the ordinate axis indicates intensity (a.u).

As seen in FIG. 17, it can be seen that as the wavelength of the YG peak in the PL spectrum (broad YG) having the enlarged FWHM is changed, the form of a spectrum is changed, and thus, panel efficiency is overall changed.

FIG. 18 is a chart in which, after the spectrum of FIG. 17 passes through a color filter CF, efficiency and a current density based on the change in the peak intensity of each of R, G, and B channels have been analyzed.

As seen in FIG. 18, in the PL spectrum (broad YG) having the enlarged FWHM, it can be seen that the light emission efficiency (cd/A) of the red (R) channel is the highest as 8.94 in 575 nm, and the light emission efficiency (cd/A) of the green (G) channel is the highest as 35.61 in 540 nm. Also, it can be seen that the current density ($mA/cm^2$) of the red (R) channel is the highest as 53.6 in 540 nm, and the current density ($mA/cm^2$) of the green (G) channel is the highest as 34.8 in 575 nm.

However, it can be seen that the light emission efficiency (cd/A) of a spectrum having a YG peak wavelength of 564 nm is the best as 3.10 in overall panel efficiency, and the color reproduction rate of the spectrum having the YG peak wavelength of 564 nm is the best as 119.8 even in a color reproduction rate.

According to the embodiments of the present invention, matching between the PL spectrum and the emittance spectrum is improved, and therefore, color shift due to the increase in a viewing angle is reduced, thus enhancing color viewing angle characteristic.

Moreover, the light emission efficiency of red light in the EL spectrum is improved, and therefore, the Voled voltage decreases, thus improving the light emission efficiency of the panel.

Moreover, the FWHM of the peak wavelength in the PL spectrum is broadened, thus increasing a color reproduction rate and light emission efficiency.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device, comprising:
   a substrate;
   a thin film transistor formed on the substrate;
   a first electrode formed on the thin film transistor;
   an organic emission layer comprising:
      a first stack that comprises a first emission layer formed on the first electrode to emit light of a first color;
      a second stack that comprises a second emission layer formed on the first electrode to emit light of a second color; and
      a charge generation layer formed between the first and second stacks; and
   a second electrode formed on the organic emission layer, wherein:
      the first emission layer comprises a first dopant in such an amount that a first peak wavelength is shorter than a second peak wavelength, the first peak wavelength being a peak wavelength of the first color in a photoluminescence (PL) spectrum, the second peak wavelength being a peak wavelength of the first color in an emittance spectrum, and
      the second emission layer comprises a second dopant in such an amount that a third peak wavelength is shorter or longer than a fourth peak wavelength, the third peak wavelength being a peak wavelength of the second color in the PL spectrum, the fourth peak wavelength being a peak wavelength of the second color in the emittance spectrum.

2. The organic light emitting display device of claim 1, wherein:
   a difference between the first peak wavelength and the second peak wavelength is equal to or less than 10 nm; and
   a difference between the third peak wavelength and the fourth peak wavelength is equal to or less than ±10 nm.

3. The organic light emitting display device of claim 1, wherein:
   the first color is blue; and
   the second color is yellowish green.

4. The organic light emitting display device of claim 1, wherein the amount of the second dopant is 10% to 25% of an amount of a host of the second emission layer.

5. The organic light emitting display device of claim 1, wherein the second dopant enables the third peak wavelength to be 540 nm to 575 nm.

6. The organic light emitting display device of claim 1, wherein a color-coordinate change amount ($\Delta u'v'$) in CIE 1931 standard colorimetric system is equal to or less than 0.02 in a viewing angle direction of 0 degrees to 60 degrees of light emitted from the organic light emitting display device.

7. The organic light emitting display device of claim 1, further comprising an overcoat layer and a light compensation layer between the thin film transistor and the first electrode.

8. The organic light emitting display device of claim 7, wherein the light compensation layer has a refractive index of 1.8 to 2.3.

9. The organic light emitting display device of claim 7, wherein the light compensation layer has a thickness of 1100 Å to 2500 Å.

10. The organic light emitting display device of claim 1, wherein a full width at half maximum of the third peak wavelength is equal to or greater than 80 nm.

11. The organic light emitting display device of claim 10, wherein the third peak wavelength is 540 nm to 575 nm.

12. The organic light emitting display device of claim 1, wherein the first peak wavelength is shorter than the third peak wavelength and the second peak wavelength is shorter than the fourth peak wavelength.

13. The organic light emitting display device of claim 1, wherein:
   the first stack is formed on the first electrode;
   the charge generation layer is formed on the first stack; and
   the second stack is formed on the charge generation layer.

14. The organic light emitting display device of claim 13, wherein:
   the first peak wavelength is shorter than the third peak wavelength; and
   the second peak wavelength is shorter than the fourth peak wavelength.

* * * * *